（12）United States Patent
Kim et al.

(10) Patent No.: US 9,437,275 B2
(45) Date of Patent: Sep. 6, 2016

(54) MEMORY SYSTEM AND METHOD FOR OPERATING THE SAME

(71) Applicant: SK hynix Inc., Gyeonggi-do (KR)

(72) Inventors: Jung-Hyun Kim, Gyeonggi-do (KR); Ki-Chang Kwean, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 14/136,997

(22) Filed: Dec. 20, 2013

(65) Prior Publication Data

US 2015/0120999 A1    Apr. 30, 2015

(30) Foreign Application Priority Data

Oct. 28, 2013  (KR) ........................ 10-2013-0128497

(51) Int. Cl.
| | |
|---|---|
| *G11C 11/40* | (2006.01) |
| *G11C 11/406* | (2006.01) |
| *G11C 11/408* | (2006.01) |
| *G11C 7/02* | (2006.01) |
| *G11C 11/404* | (2006.01) |

(52) U.S. Cl.
CPC ............ *G11C 11/40611* (2013.01); *G11C 7/02* (2013.01); *G11C 11/4085* (2013.01); *G11C 11/404* (2013.01)

(58) Field of Classification Search
CPC ................ G11C 11/40611; G11C 11/4085
See application file for complete search history.

(56) References Cited

U.S. PATENT DOCUMENTS

| | | | |
|---|---|---|---|
| 2011/0141836 | A1 | 6/2011 | Luthra et al. |
| 2014/0095780 | A1* | 4/2014 | Bains .................... G11C 11/406 711/105 |

FOREIGN PATENT DOCUMENTS

| | | |
|---|---|---|
| KR | 1020080069272 | 7/2008 |
| KR | 1020140038246 | 3/2014 |
| KR | 1020140139849 | 12/2014 |

* cited by examiner

*Primary Examiner* — Edward Dudek, Jr.
(74) *Attorney, Agent, or Firm* — IP & T Group LLP

(57) ABSTRACT

A memory system may include a memory including a cell array having a plurality of word lines and an address storage unit that stores an address in response to a capture command, wherein the memory sequentially refreshes the word lines in response to a refresh command at a set cycle, and refreshes a word line corresponding to the stored address in response to the refresh command when the address is stored in the address storage unit; and a memory controller transmitting the refresh command to the memory at the set cycle when a word line satisfying one or more of conditions that the number of activation times is equal to or more than a reference number and an activation frequency is equal to or more than a reference frequency is detected, and transmitting the capture command and an address of the detected word line to the memory.

12 Claims, 5 Drawing Sheets

MEMORY SYSTEM AND METHOD FOR OPERATING THE SAME

CROSS-REFERENCE TO RELATED APPLICATIONS

The present application claims priority of Korean Patent Application No. 10-2013-0128497, filed on Oct. 28, 2013, which is incorporated herein by reference in its entirety.

BACKGROUND

1. Field

Exemplary embodiments of the present invention relate to a memory system and a method for operating the same.

2. Description of the Related Art

A memory cell of a memory includes a transistor serving as a switch and a capacitor that stores charges, i.e., data. "High" (logic "1") and "low" (logic "0") of data are classified according to whether there are charges in the capacitor of the memory cell, that is, whether a potential between both terminals of the capacitor is high or low.

Since data retention represents that charges are accumulated in the capacitor, there is no power consumption in principle. However, data may be lost since initial charges stored in the capacitor are lost by a leakage current due to a PN junction and the like of a metal oxide semiconductor (MOS) transistor. To substantially prevent such a loss, it is necessary to read data of the memory cell before the data is lost and to recharge normal charges according to the read information. Only when such an operation is periodically repeated, data storage is substantially maintained. Such a recharge process of the cell charge is called a refresh operation.

The refresh operation is performed whenever a refresh command is applied from a memory controller to a memory, wherein the memory controller applies the refresh command to the memory at a set time interval taking into consideration a data retention time of the memory. For example, when all memory cells of the memory may be refreshed when the data retention time of the memory is 64 ms and the refresh command is applied 8,000 times, the memory controller applies the refresh command to the memory 8,000 times for 64 ms.

With an increase in the degree of integration of a memory, an interval among a plurality of word lines included in the memory is reduced, resulting in an increase in a coupling effect between adjacent word lines. Therefore, when a specific word line is excessively activated several times or is frequently refreshed in the memory during a refresh operation, data of a memory cell MC coupled to a word line adjacent to the specific word line may be lost. Such a phenomenon is called word line disturbance.

SUMMARY

Various exemplary embodiments of the present invention are directed to a memory system that normally operates by performing a target refresh operation even when data of a memory cell may deteriorate due to word line disturbance, and a method for operating the same.

Embodiments of the present invention are directed to a memory system capable of operating at a high speed by reducing a time necessary for a target refresh operation, and a method for operating the same.

In accordance with an exemplary embodiment of the present invention, a memory system includes: a memory suitable for including a cell array having a plurality of word lines and an address storage unit that stores an address in response to a capture command, wherein the memory sequentially refreshes the plurality of word lines in response to a refresh command inputted at a set cycle, and refreshes a word line corresponding to the stored address among the plurality of word lines in response to the refresh command when the address is stored in the address storage unit; and a memory controller suitable for transmitting the refresh command to the memory at the set cycle when a word line satisfying one or more of conditions that the number of activation times is equal to or more than a reference number and an activation frequency is equal to or more than a reference frequency is detected, and transmitting the capture command and an address of the detected word line to the memory.

In accordance with another exemplary embodiment of the present invention, a memory system includes: a memory suitable for including a cell array having a plurality of word lines, sequentially refreshing the plurality of word lines in response to a refresh command inputted at a set cycle, and refreshing a word line corresponding to an input address and one or more adjacent word lines adjacent to the word line corresponding to the input address in response to a target refresh command; and a memory controller suitable for transmitting the refresh command to the memory at the set cycle when a word line satisfying one or more of conditions that the number of activation times is equal to or more than a reference number and an activation frequency is equal to or more than a reference frequency is detected, and transmitting the target refresh command and an address of the detected word line to the memory.

In accordance with another embodiment of the present invention, a method for operating a memory system including a memory having a plurality of word lines and a memory controller includes: transmitting, by the memory controller, a capture command and an address of a word line to the memory when the word line is detected from among the plurality of word lines, the word line satisfying one or more of conditions that a number of activation times is equal to or more than a reference number and an activation frequency is equal to or more than a reference frequency; storing, by the memory, the address transmitted from the memory controller in response to the capture command; and sequentially refreshing, by the memory, the plurality of word lines in response to a refresh command inputted at a set cycle, and refreshing a word line corresponding to the stored address in response to the refresh command when the address is stored in response to the capture command.

In accordance with another embodiment of the present invention, a method for operating a memory system including a memory having a plurality of word lines and a memory controller includes: transmitting, by the memory controller, a refresh command to the memory at a set cycle, and transmitting a target refresh command and an address of a word line to the memory when the word line is detected from among the plurality of word lines, the word line satisfying one or more of conditions that a number of activation times is equal to or more than a reference number and an activation frequency is equal to or more than a reference frequency; and sequentially refreshing, by the memory, the plurality of word lines in response to the refresh command inputted at the set cycle, and refreshing a word line corresponding to an input address and one or more adjacent word lines adjacent to the word line corresponding to the input address in response to the target refresh command.

According to the present technology, it is possible to store a frequently activated word line with the large number of activation times or a high activation frequency, and to perform a target refresh operation based on a stored address, thereby substantially preventing a word line disturbance.

Furthermore, it is possible for a memory system to operate at a high speed by reducing a time necessary for a target refresh operation.

DETAILED DESCRIPTION

Figure 1:
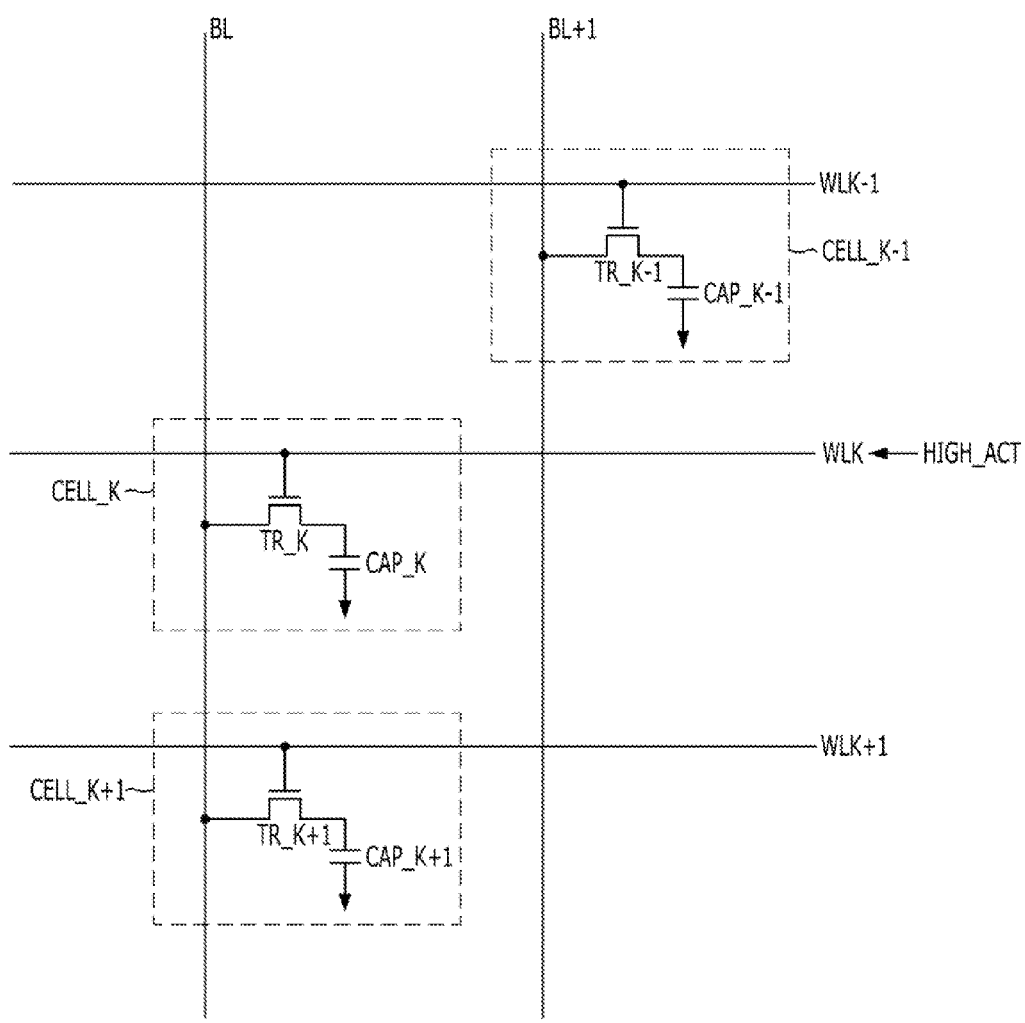
FIG. 1 is a diagram illustrating a part of a cell array included in a memory for describing a word line disturbance.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is diagram illustrating a part of a cell array included in a memory for describing a word line disturbance.

Referring to FIG. 1, "WLK−1", "WLK", and "WLK+1" in the cell array indicate three word lines arranged in parallel with one another. The word line WLK designated by "HIGH_ACT" indicates a frequently activated word line with the large number of activation times or a high activation frequency, and the word lines WLK−1 and WLK+1 indicate adjacent word lines arranged adjacent to the word line WLK. "CELL_K−1", "CELL_K", and "CELL_K+1" indicate memory cells coupled to the word lines WLK−1, WLK, and WLK+1, respectively. The memory cells CELL_K−1, CELL_K, and CELL_K+1 include a cell transistor TR_K−1 and a cell capacitor CAP_K−1, a cell transistor TR_K and a cell capacitor CAP_K, and a cell transistor TR_K+1 and a cell capacitor CAP_K+1, respectively. For reference, "BL" and "BL+1" indicate a bit line.

In FIG. 1, when the frequently activated word line WLK is activated and precharged, voltages of the adjacent word lines WLK−1 and WLK+1 Increase or decrease due to a coupling phenomenon occurring between the frequently activated word line WLK and the adjacent word lines WLK−1 and WLK+1, thereby affecting the amount of charge stored in the cell capacitors CAP_K−1 and CAP_K+1. Accordingly, when the frequently activated word line WLK is considerably activated and precharged, and is toggled at the activated state and the precharged state, data stored in the memory cells CELL_K−1 and CELL_K+1 may be damaged due to a change in the amount of charge stored in the cell capacitors CAP_K−1 and CAP_K+1.

Furthermore, an electromagnetic wave, which has been generated when the word line is toggled at the activated state and the precharged state, allows electrons of a cell capacitor included in a memory cell coupled to an adjacent word line to be introduced and discharged, so that data of the memory cell may be damaged.

Figure 2:
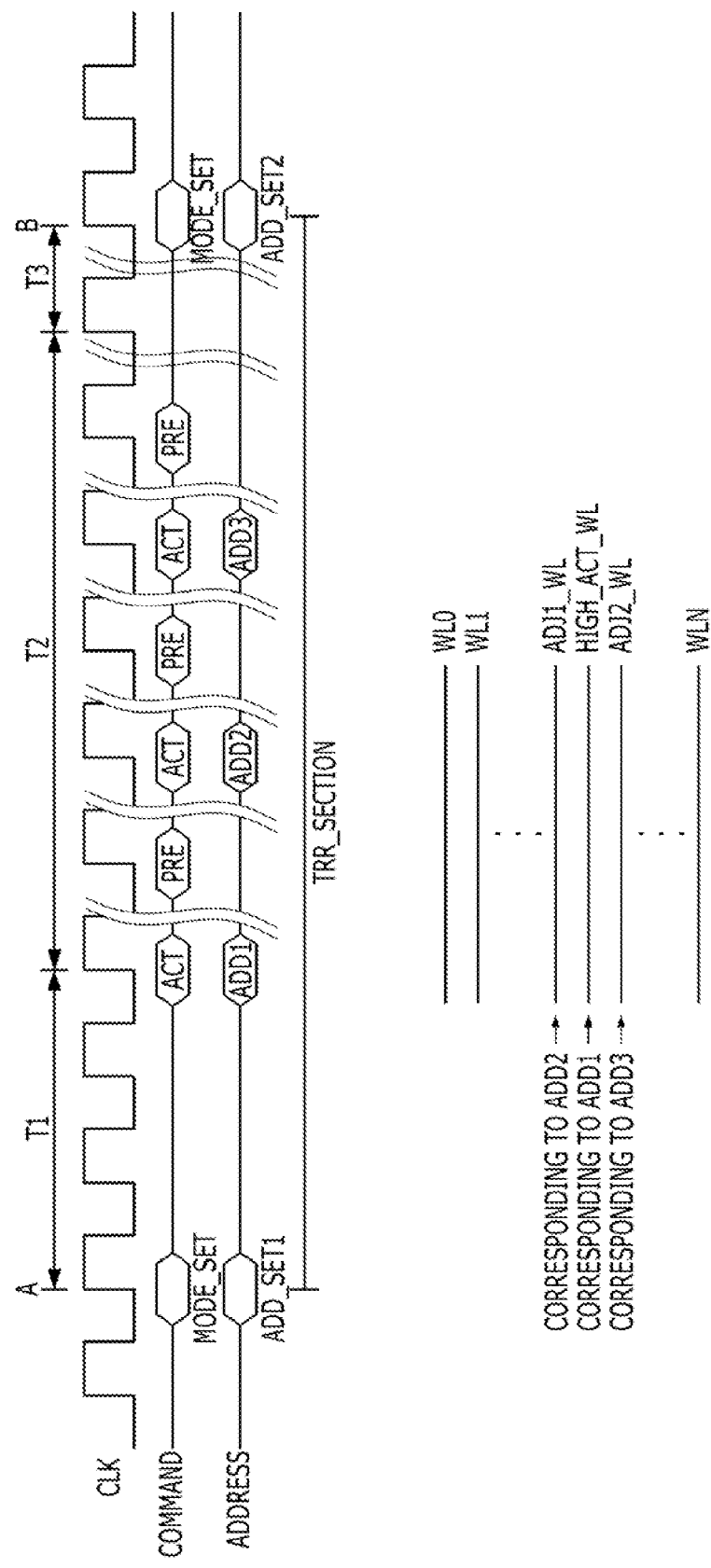
FIG. 2 is a timing diagram describing a target refresh operation in which adjacent word lines adjacent to a frequently activated word line are refreshed.

FIG. 2 is a diagram for describing a target refresh operation in which adjacent word lines adjacent to a frequently activated word line are refreshed.

Referring to FIG. 2, commands MODE_SET, ACT, and PRE, and addresses ADD1 to ADD3 and ADD_SET may be inputted in synchronization with a clock signal CLK.

A memory may include a plurality of word lines WL0 to WLN, each coupled to a plurality of memory cells (not illustrated), respectively.

When a frequently activated word line HIGH_ACT_WL is detected, a memory controller (not illustrated) may apply the command MODE_SET for setting a mode to the memory. The command MODE_SET may be a mode register set (MRS) command of the memory. The memory controller may apply an address ADD_SET1 for allowing the memory to enter a target refresh section to the memory together with the command MODE_SET. Through the aforementioned operation, the memory may enter (A) the target refresh section TRR_SECTION for performing a target refresh operation.

When the memory enters the target refresh section TRR_SECTION, the memory controller may sequentially apply the active command ACT and the precharge command PRE to the memory, and may apply the address ADD1 corresponding to the frequently activated word line HIGH_ACT_WL and the addresses ADD2 and ADD3 for selecting adjacent word lines ADJ1_WL and ADJ2_WL. During the target refresh section TRR_SECTION, the memory may sequentially refresh the frequently activated word line HIGH_ACT_WL and the adjacent word lines ADJ1_WL and ADJ2_WL.

When the target refresh operation is completed, the memory controller may apply the mode setting command MODE_SET and an address ADD_SET2 to the memory, thereby ending (B) the target refresh mode of the memory using a method similar to that when the target refresh mode is set. The target refresh operation of FIG. 2 requires a time T1 for setting the mode of the memory as the target refresh mode, a time T2 for refreshing a word line by applying a command, a time T3 for ending the target refresh mode of the memory, and the like.

Figure 3:
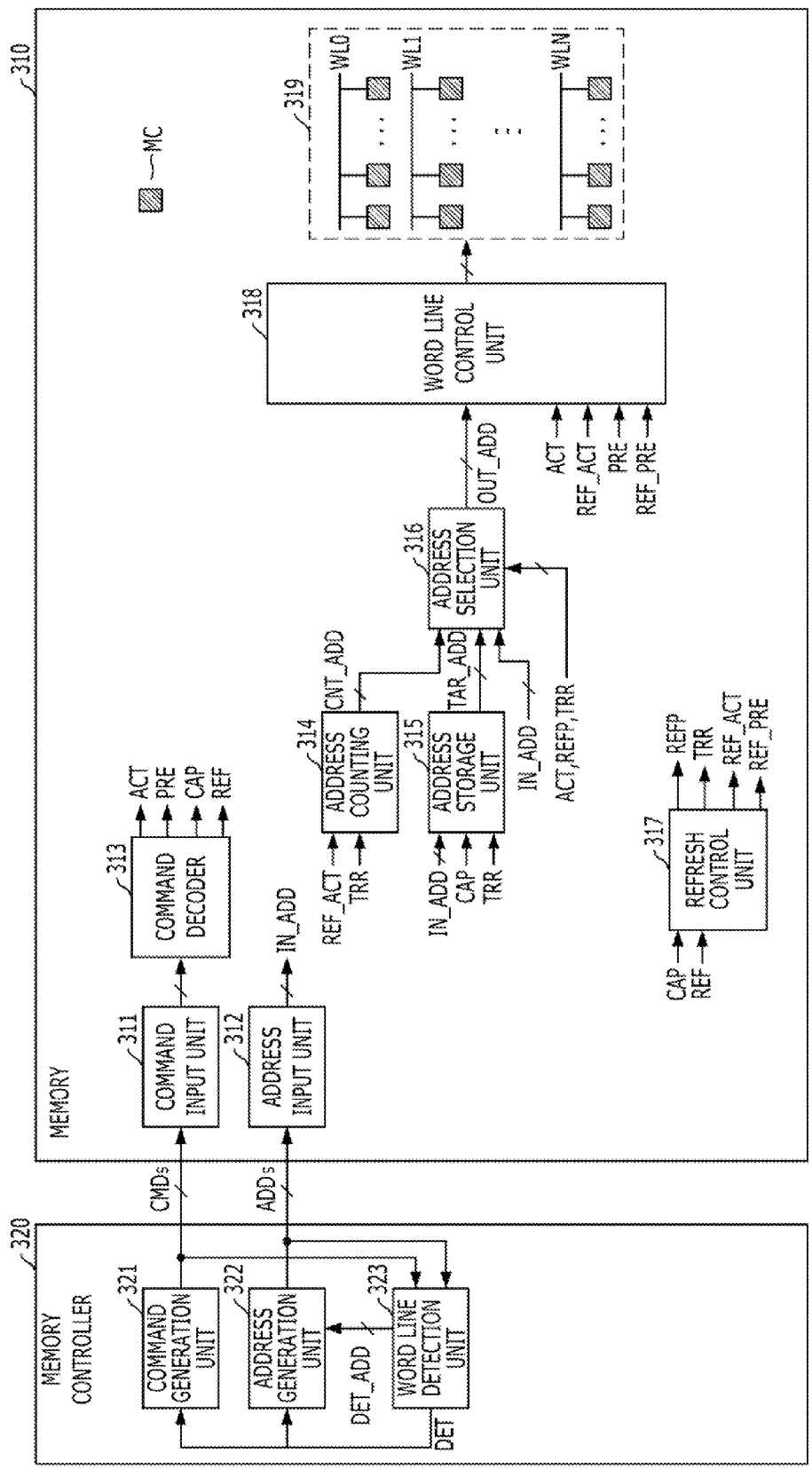
FIG. 3 is a block diagram illustrating a memory system according to an exemplary embodiment of the present invention.

FIG. 3 is a block diagram illustrating a memory system according to an exemplary embodiment of the present invention.

As illustrated in FIG. 3, the memory system may include a memory 310 and a memory controller 320. The memory 310 may include a command input unit 311, an address input unit 312, a command decoder 313, an address counting unit 314, an address storage unit 315, an address selection unit 316, a refresh control unit 317, a word line control unit 318, and a cell array 319. The memory controller 320 may include a command generation unit 321, an address generation unit 322, and a word line detection unit 323. The cell array 319 may include a plurality of word lines WL0 to WLN to which one or more memory cells MCs have been coupled. FIG. 3 illustrates a configuration related to an activation operation and a refresh operation in the memory system. Configurations related to other operations, such as a read operation or a write operation, that are not directly related to the present invention have not been illustrated.

With reference to FIG. 3, the memory system will be described. Hereinafter, a refresh operation for sequentially refreshing the plurality of word lines WL0 to WLN is called a "normal refresh operation" and an operation for refreshing a selected word line based on an address stored in the address storage unit 315 is called a "target refresh operation."

The command input unit 311 may receive command signals CMDs applied from the memory controller 320, and the address input unit 312 may receive addresses ADDs applied from the memory controller 320 to output an input address IN_ADD. The command signals CMDs and the addresses ADDs may include multi-bit signals, respectively.

The command decoder 313 may decode the command signals CMDs inputted through the command input unit 311, and generate an active command ACT, a refresh command REF, a precharge command PRE, and a capture command CAP. The command decoder 313 may activate the active command ACT when a combination of the inputted command signals CMDs indicates the active command ACT, activate the refresh command REF when the combination indicates the refresh command REF, activate the precharge command PRE when the combination indicates the precharge command PRE, and activate the capture command CAP when the combination corresponds to the capture command CAP. Additionally, the command decoder 313 may decode the inputted command signals CMDs and generate read and write commands and the like. However, since these commands are not directly related to the memory according to the exemplary embodiment of the present invention, an illustration and description thereof will be omitted.

The address counting unit 314 performs a counting operation whenever the cell array 319 is refreshed, and generates a counting address CNT_ADD based on a result of the counting operation. The address counting unit 314 increases a value of the counting address CNT_ADD by 1 whenever a refresh active signal REF_ACT is activated. Increasing the value of the address by 1 represents that when the word line WLK has been previously selected K times, an address is changed such that the word line WLK+1 is selected K+1 times next time. The address counting unit 314 may not perform the counting operation when a target refresh signal TRR has been activated even though a word line is refreshed. This is due to the counting address CNT_ADD not being used in the target refresh operation.

When the capture command CAP is activated, the address storage unit 315 may store the input address IN_ADD inputted from the address input unit 312 together with the capture command CAP. The input address IN_ADD inputted together with the capture command CAP may include an address of a word line with the number of activation times equal to or more than a reference number or with an activation frequency equal to or more than a reference frequency. When the target refresh signal TRR is activated, the address storage unit 315 may sequentially output one or more addresses of the stored address hereinafter, referred to as a "target address TAR_ADD", and one or more adjacent addresses. The adjacent addresses may include addresses of one or more word lines adjacent to a word line corresponding to the address stored in the address storage unit 315.

For example, a plurality of word lines WL0 to WLN have been sequentially arranged and have addresses with values of "0" to "N" that have been allocated to the plurality of word lines WL0 to WLN, respectively. When an address "K" is stored together with the capture command CAP, the address storage unit 315 may store the address K. When the target refresh signal TRR is activated, the address storage unit 315 may sequentially output one or more of the K and K−1 and K+1 that are addresses of the word lines WLK−1 and WLK+1 adjacent to the word line WLK corresponding to the K. The K−1 and the K+1 may be generated by subtracting 1 from the K address stored in the address storage unit 315 and by adding 1 to the K address stored in the address storage unit 315, respectively.

The address selection unit 316 may receive the input address IN_ADD, the counting address CNT_ADD, and the target address TAR_ADD, then may select one from these addresses, and output the selected address as an output address OUT_ADD. The address selection unit 316 may select the input address IN_ADD when the active command ACT is activated, select the counting address CNT_ADD when a refresh signal REFP is activated, and select the target address TAR_ADD when the target refresh signal TRR is activated.

When the refresh command REF is activated, the refresh control unit 317 may activate the refresh signal REFP. When the refresh command REF is activated after the capture command CAP is activated, the refresh control unit 317 may activate the target refresh signal TRR. Furthermore, the refresh control unit 317 may activate the refresh active signal REF_ACT in response to the refresh command REF, and activate a refresh precharge signal REF_PRE after a set time passes. The number of times, by which the refresh control unit 317 activates the refresh active signal REF_ACT and the refresh precharge signal REF_PRE in response to one refresh command REF, may be changed according to design.

For example, in the normal refresh operation, one word line is refreshed when the refresh command REF is activated once, and in the target refresh operation, three word lines are activated when the refresh command REF is activated once. The word lines refreshed in the target refresh operation may include a frequently activated word line WLK corresponding to the address stored in the address storage unit 315, and two adjacent word lines WLK−1 and WLK+1 adjacent to the frequently activated word line WLK. Accordingly, the refresh control unit 317 may activate the refresh active signal REF_ACT and the refresh precharge signal REF_PRE once when the refresh command REF is activated, and activate the refresh active signal REF_ACT and the refresh precharge signal REF_PRE three times when the target refresh signal TRR is activated.

The target refresh signal TRR may be activated for a time necessary for the target refresh operation. For example, when three word lines are refreshed in the target refresh operation, the target refresh signal TRR may be activated for a time necessary for sequentially activating and precharging the three word lines.

The word line control unit 318 may activate a word line, which corresponds to the output address OUT_ADD, among the plurality of word lines WL0 to WLN when the active command ACT or the refresh active signal REF_ACT is activated. Furthermore, the word line control unit 318 may precharge the activated word line when the precharge command PRE or the refresh precharge signal REF_PRE is activated. When a specific word line is activated and precharged, refresh of memory cells coupled to the specific word line may be completed.

The memory controller 320 may transmit command signals CMDs corresponding to the refresh command REF to the memory 310 at a set cycle, and when a word line, which satisfies one or more of conditions that the number of activation times is equal to or more than the reference number and the activation frequency is equal to or more than the reference frequency, is detected from among the plurality of word lines WL0 to WLN, the memory controller 320 may transmit command signals CMDs corresponding to the capture command CAP and an address of the detected word line to the memory 310.

The command generation unit 321 may generate the command signals CMDs for controlling an operation of the memory 310, and transmit the command signals CMDs to the memory 310. The command generation unit 321 may generate the command signals CMDs corresponding to the refresh command REF at a set cycle, and when a detection signal DET is activated, the command generation unit 321 may generate the command signals CMDs corresponding to the capture command CAP and transmit the command signals CMDs to the memory 310. Additionally, the command generation unit 321 may generate command signals CMDs corresponding to the active command ACT, the precharge command PRE, a read command, a write command and the like, and transmit the command signals CMDs to the memory 310.

The address generation unit 322 may generate addresses ADDs corresponding to a memory cell MC to be accessed, among a plurality of memory cells MCs of the memory 310, and transmit the addresses ADDs to the memory 310. The address generation unit 322 may generate a row address and transmit the row address to the memory 310 in a row operation of the memory 310 for example, an activation operation, a precharge operation and the like, and may generate a column address and transmit the column address to the memory 310 in a column operation) of the memory 310 for example, a read operation, a write operation and the like. The address generation unit 322 may generate no address in a refresh operation of the memory 310, and when the detection signal DET is activated, the address generation unit 322 may generate an address corresponding to the detected word line based on a detection address DET_ADD outputted from the word line detection unit 323, and transmit the address to the memory 310.

The word line detection unit 323 may activate the detection signal DET and output the detection address DET_ADD when a frequently activated word line or an address corresponding to the frequently activated word line is detected hereinafter, referred to as a "high active address". Particularly, when a word line is detected from among the plurality of word lines WL0 to WLN that satisfies one or more of conditions of the number of activation times being equal to or more than the reference number and the activation frequency being equal to or more than the reference frequency, the word line detection unit 323 may activate the detection signal DET and output the detection address DET_ADD of the detected word line. To detect the word line with the number of activation times equal to or more than the reference number, the word line detection unit 323 may receive the command signals CMDs and the addresses ADDs, and count the number of times by which an address corresponding to each word line has been transmitted to the memory 310 together with the command signals CMDs corresponding to the active command ACT.

The word line detection unit 323 may compare the number of times, by which each word line has been activated, with the reference number, and when a word line with the number of activation times larger than the reference number is detected, the word line detection unit 323 may activate the detection signal DET and output the detection address DET_ADD of the detected word line. For example, when the reference number is set to $10^5$, and a word line with the number of activation times equal to or more than $10^5$ is detected, the word line detection unit 323 may activate the detection signal DET and output the detection address DET_ADD corresponding to the detected word line. A counting value corresponding to the detected word line may be initialized, and the number of activation times of the detected word line may be counted again from the beginning.

The word line detection unit 323 may store active history in preset sections of the plurality of word lines WL0 to WLN, compare the activation frequency of the word lines with the reference frequency, activate the detection signal DET and output the detection address DET_ADD of the detected word line when a word line with the activation frequency higher than the reference frequency is detected. For example, when the reference frequency represents that a word line is activated twice when an active operation is performed five times, the word line detection unit 323 may detect a word line twice or more when the active operation is performed five times, referring to word lines activated for recent active operations of $10^4$ times i.e., preset sections.

Hereinafter, an operation of the memory system will be described. When the memory 310 refreshes one word line in response to the refresh command REF and the capture command CAP is activated, the memory 310 refreshes three word lines, i.e., a word line corresponding to an address stored in the address storage unit 315, a first adjacent word line and a second adjacent word line, which are adjacent to the word line corresponding to the address stored in the address storage unit 315, in response to the refresh command REF.

The memory controller 320 may transmit the command signals CMDs corresponding to the refresh command REF to the memory 310 at a set cycle. The memory 310 may sequentially refresh the plurality of word lines WL0 to WLN one by one whenever the refresh command REF is activated. The memory controller 320 may apply the active command ACT, the write command, the read command, the precharge command PRE and the like between the refresh commands REF, thereby accessing memory cells selected by an address among the memory cells MCs included in the memory 310.

When a frequently activated word line is detected, the memory controller 320 may transmit the command signals CMDs corresponding to the capture command CAP and the addresses ADDs corresponding to the detection address DET_ADD to the memory 310. The memory 310 may store the input address IN_ADD in response to the capture command CAP, and when the refresh command REF is activated, the memory 310 may sequentially output the stored address, the first adjacent address, and the second adjacent address as the target address TAR_ADD in a section in which the target refresh signal TRR has been activated. When the stored address corresponds to the WLK, the first adjacent address may correspond to the WLK−1 and the second adjacent address may correspond to the WLK+1. The memory 310 may sequentially refresh the WLK, WLK−1, and WLK+1 word lines in response to the target address TAR_ADD in the section in which the target refresh signal TRR has been activated.

The memory system according to an exemplary embodiment of the present invention may substantially prevent deterioration of data of a memory cell due to a word line disturbance, and may perform a high speed operation by minimizing a time necessary for the target refresh operation.

Figure 4:
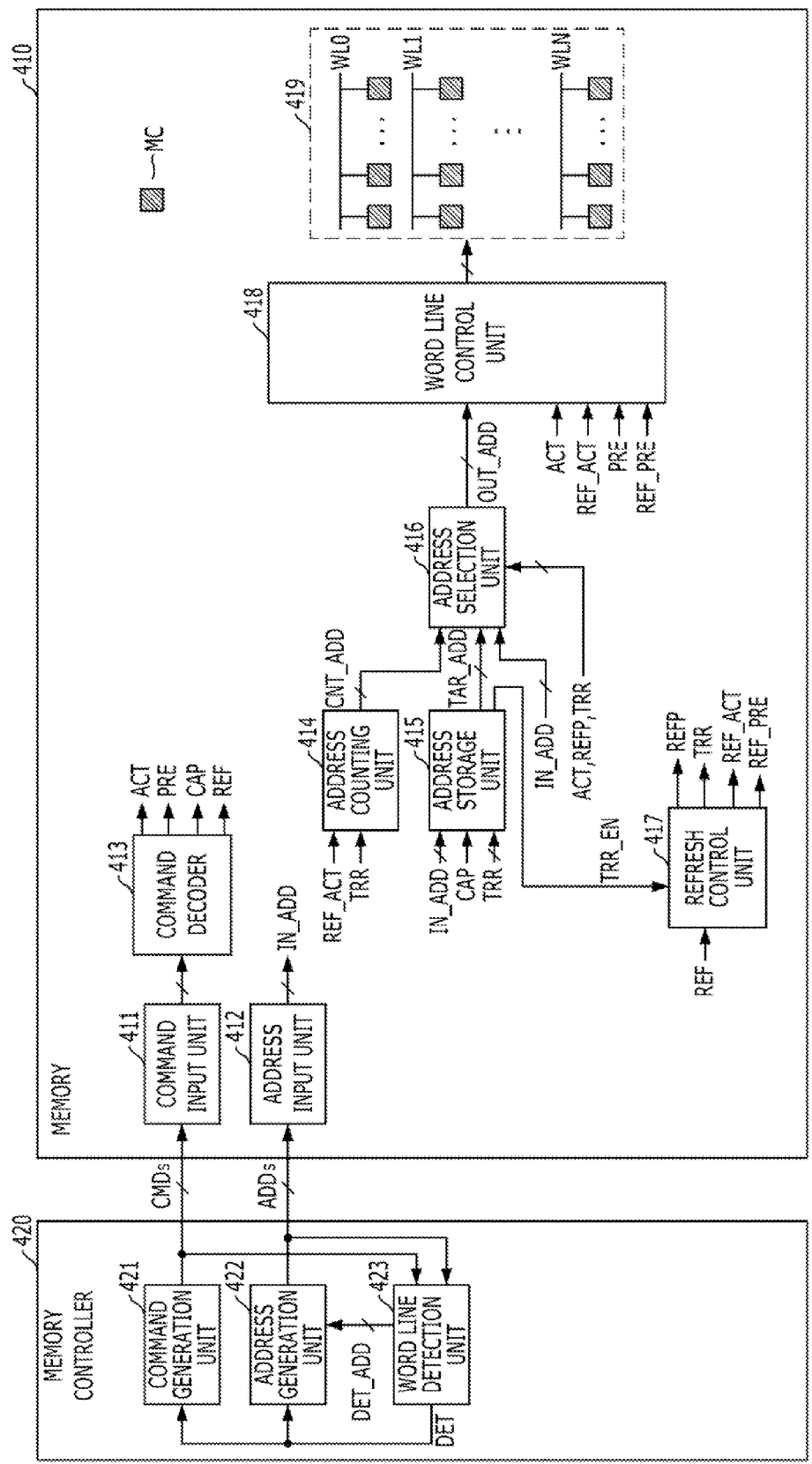
FIG. 4 is a block diagram illustrating a memory system according to an exemplary embodiment of the present invention.

FIG. 4 is a block diagram illustrating a memory system according to an exemplary embodiment of the present invention. The memory system of FIG. 4 may perform the target refresh operation whenever the normal refresh operation is performed by a set number of times which is different from the memory system of FIG. 3.

As illustrated in FIG. 4, the memory system may include a memory 410 and a memory controller 420. The memory 410 may include a command input unit 411, an address input unit 412, a command decoder 413, an address counting unit 414, an address storage unit 415, an address selection unit 416, a refresh control unit 417, a word line control unit 418, and a cell array 419. The memory controller 420 may include a command generation unit 421, an address generation unit 422, and a word line detection unit 423. The cell array 419 may include a plurality of word lines WL0 to WLN to which one or more memory cells MCs have been coupled. FIG. 4 illustrates only a configuration related to an activation operation and a refresh operation in the memory system. Configurations related to operations, such as a read operation or a write operation, that are not directly related to the present invention have not been illustrated.

With reference to FIG. 4, the memory system will be described. Except for the address storage unit 415 and the refresh control unit 417 of the memory 410 of FIG. 4, operations of elements 411 to 414, 416, 418, and 419 are substantially the same as those of corresponding elements of the memory 310 of FIG. 3. Furthermore, operations of elements 421 to 423 of the memory controller 420 of FIG. 4 are substantially the same as those of the elements 321 to 323 of the memory controller 320 of FIG. 3.

The address storage unit 415 may store the input address IN_ADD inputted together with the capture command CAP when the capture command CAP is activated. The input address IN_ADD inputted together with the capture command CAP may include an address of a word line with the number of activation times equal to or more than a reference number or with an activation frequency equal to or more than a reference frequency. When the input address IN_ADD is stored, the address storage unit 415 may activate a target refresh enable signal TRR_EN. The target refresh enable signal TRR_EN may indicate that the target refresh operation is performed during a future refresh operation. When the target refresh signal TRR is activated, the address storage unit 415 may sequentially output one or more addresses of the stored address hereinafter, referred to as a "target address TAR_ADD", and one or more adjacent addresses. The adjacent addresses may include addresses of one or more word lines adjacent to a word line corresponding to an address stored in the address storage unit 415.

For example, a plurality of word lines WL0 to WLN have been sequentially arranged and have addresses with values of "0" to "N" that have been allocated to the plurality of word lines WL0 to WLN, respectively. When an address "K" is stored together with the capture command CAP, the address storage unit 415 may store the address K. When the target refresh signal TRR is activated, the address storage unit 415 may sequentially output one or more of the K, K−1 and K+1 addresses of the word lines WLK−1 and WLK+1 adjacent to the word line WLK corresponding to K. The K−1 and the K+1 may be generated by subtracting 1 from the K stored in the address storage unit 415 and by adding 1 to the K stored in the address storage unit 415, respectively.

When the refresh command REF is activated, the refresh control unit 417 may activate the refresh signal REFP. When the target refresh enable signal TRR_EN has been activated and the refresh command REF is activated by a set number of times, the refresh control unit 417 may activate the target refresh signal TRR. For example, when the target refresh enable signal TRR_EN has been activated, the refresh control unit 417 may activate the target refresh signal TRR when the refresh command REF is activated four times. Furthermore, the refresh control unit 417 may activate the refresh active signal REF_ACT in response to the refresh command REF, and activate the refresh precharge signal REF_PRE after a set time passes. The number of times, by which the refresh control unit 417 activates the refresh active signal REF_ACT and the refresh precharge signal REF_PRE in response to one refresh command REF, may be changed according to design.

The memory system according to an exemplary embodiment of the present invention may substantially prevent deterioration of data of a memory cell due to a word line disturbance, and may perform a high speed operation by minimizing a time necessary for the target refresh operation.

With reference to FIG. 3 and FIG. 4, a method for operating the memory system according to an exemplary embodiment of the present invention will be described.

The method for operating the memory system may include a step hereinafter, referred to as a "capture command transmission step" in which the memory controllers 320 and 420 transmit the high active address and the capture command CAP to the memories 310 and 410 when the frequently activated word line or the high active address is detected, a step hereinafter, referred to as a "high active address storage step" in which the memories 310 and 410 store the transmitted high active address in response to the capture command CAP, and a step hereinafter, referred to as a "refresh step", in which the memories 310 and 410 sequentially refresh the plurality of word lines WL0 to WLN in response to the refresh command REF inputted at a set cycle, and refresh word lines selected based on an address in response to the refresh command REF when the address is stored in response to the capture command CAP.

The memory controllers 320 and 420 may transmit the refresh command REF to the memories 310 and 410 at a set cycle, and when the high active address is detected, the memory controllers 320 and 420 may transmit the capture command CAP and the high active address to the memories 310 and 410 in the capture command transmission step.

In the high active address storage step, the memories 310 and 410 may store the address transmitted from the memory controllers 320 and 420 in response to the capture command CAP.

In the refresh step, the memories 310 and 410 may perform the normal refresh operation or the target refresh operation in response to the refresh command REF. Particularly, when the capture command CAP is not applied, the memories 310 and 410 may perform the normal refresh operation in response to the refresh command REF. When the capture command CAP is applied, the memories 310 and 410 may refresh word lines, i.e., a frequently activated word line and one or more adjacent word lines, selected based on the stored address in response to the refresh command REF.

Figure 5:
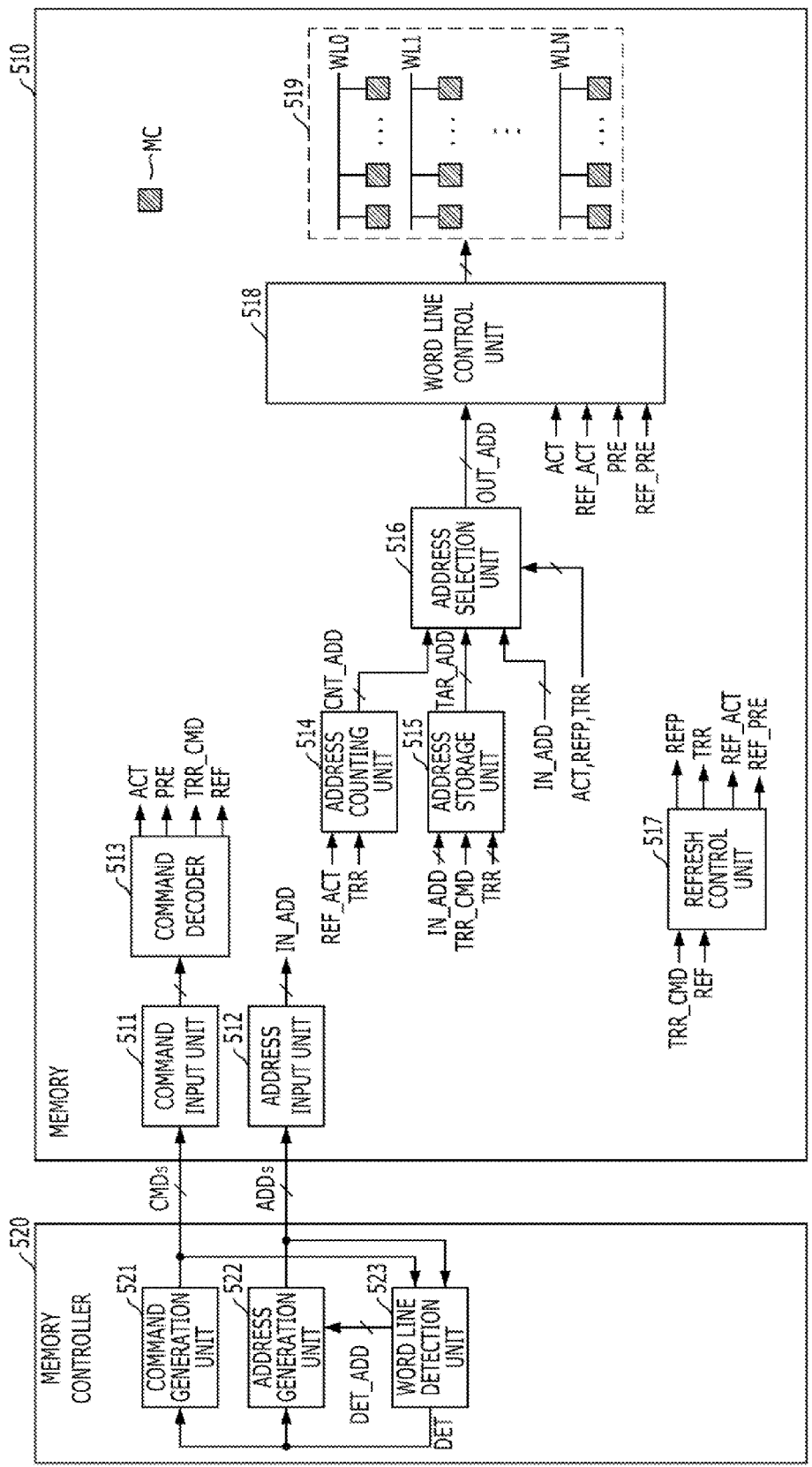
FIG. 5 is a block diagram illustrating a memory system according to an exemplary embodiment of the present invention.

FIG. 5 is a block diagram illustrating a memory system according to an exemplary embodiment of the present invention. The memory system of FIG. 5 may perform the target refresh operation when a target refresh command TRR_CMD is applied from a memory controller 520.

As illustrated in FIG. 5, the memory system may include a memory 510 and the memory controller 520. The memory 510 may include a command input unit 511, an address input unit 512, a command decoder 513, an address counting unit 514, an address storage unit 515, an address selection unit 516, a refresh control unit 517, a word line control unit 518, and a cell array 519. The memory controller 520 may include a command generation unit 521, an address generation unit 522, and a word line detection unit 523. The cell array 519 may include a plurality of word lines WL0 to WLN to which one or more memory cells MCs have been coupled. FIG. 5 illustrates only a configuration related to an activation operation and a refresh operation in the memory system. Configurations related to operations, such as a read operation or a write operation, that are not directly related to the present invention have not been illustrated.

With reference to FIG. 5, the memory system will be described. Except for the command decoder 513, the address storage unit 515, and the refresh control unit 517 of the memory 510 of FIG. 5, operations of elements 511, 512, 514, 516, 518, and 519 are substantially the same as those of corresponding elements of the memory 310 of FIG. 3.

The command decoder 513 may decode command signals CMDs inputted through the command input unit 511, and generate the active command ACT, the refresh command REF, the precharge command PRE, and the target refresh command TRR_CMD. The command decoder 513 may activate the active command ACT when a combination of the inputted command signals CMDs indicates the active command ACT, activate the refresh command REF when the combination indicates the refresh command REF, activate the precharge command PRE when the combination indicates the precharge command PRE, and activate the target refresh command TRR_CMD when the combination corresponds to the target refresh command TRR_CMD. The target refresh command TRR_CMD may be defined as a new combination of the command signals CMDs. Additionally, the command decoder 513 may decode the inputted command signals CMDs and generate read and write commands and the like. However, since these commands are not directly related to the memory according to the exemplary embodiment of the present invention, an illustration and description thereof will be omitted.

The address storage unit 515 may store the input address IN_ADD in response to the target refresh command TRR_CMD, and output one or more of the stored address and one or more adjacent addresses. When the target refresh signal TRR is activated, the address storage unit 515 may sequentially output one or more addresses of the stored address hereinafter, referred to as a "target address TAR_ADD", and the one or more adjacent addresses. The one or more adjacent addresses may include addresses of one or more adjacent word lines adjacent to a word line corresponding to the address stored in the address storage unit 515.

For example, a plurality of word lines WL0 to WLN have been sequentially arranged and have addresses with values of "0" to "N" that have been allocated to the plurality of word lines WL0 to WLN, respectively. When an address "K" is stored together with the capture command CAP, the address storage unit 515 may store the address K. When the target refresh signal TRR is activated, the address storage unit 515 may sequentially output one or more of the K, K−1 and K+1 addresses of the word lines WLK−1 and WLK+1 adjacent to the word line WLK corresponding to the K address. The K−1 and the K+1 addresses may be generated by subtracting 1 from the K address stored in the address storage unit 515 and by adding 1 to the K address stored in the address storage unit 515, respectively.

When the refresh command REF is activated, the refresh control unit 517 may activate the refresh signal REFP. When the target refresh command TRR_CMD is activated, the refresh control unit 517 may activate the target refresh signal TRR. Furthermore, the refresh control unit 517 may activate the refresh active signal REF_ACT in response to the refresh command REF or the target refresh command TRR_CMD, and activate the refresh precharge signal REF_PRE after a set time passes. The number of times, by which the refresh control unit 517 activates the refresh active signal REF_ACT and the refresh precharge signal REF_PRE in response to the refresh command REF or the target refresh command TRR_CMD, may be changed according to design.

For example, in the normal refresh operation one word line is refreshed when the refresh command REF is activated once, and three word lines are activated when the target refresh command TRR_CMD is activated once. Accordingly the refresh control unit 517 may activate the refresh active signal REF_ACT and the refresh precharge signal REF_PRE once when the refresh command REF is activated, and activate the refresh active signal REF_ACT and the refresh precharge signal REF_PRE three times when the target refresh command TRR_CMD is activated.

The memory controller 520 may transmit command signals CMDs corresponding to the refresh command REF to the memory 510 at a set cycle, and when a word line, which satisfies one or more of conditions that the number of activation times is equal to or more than the reference number and the activation frequency is equal to or more than the reference frequency, is detected from among the plurality of word lines WL0 to WLN, the memory controller 520 may transmit command signals CMDs corresponding to the target refresh command TRR_CMD and a detection address DET_ADD of the detected word line to the memory 510.

The command generation unit 521 may generate the command signals CMDs for controlling an operation of the memory 510, and transmit the command signals CMDs to the memory 510. The command generation unit 521 may generate the command signals CMDs corresponding to the refresh command REF at a set cycle, and when the detection signal DET is activated, the command generation unit 521 may generate the command signals CMDs corresponding to the target refresh command TRR_CMD and transmit the command signals CMDs to the memory 510. Additionally, the command generation unit 521 may generate command signals CMDs corresponding to the active command ACT, the precharge command PRE, the read command, the write command and the like, and transmit the command signals CMDs to the memory 510.

The address generation unit 522 may generate addresses ADDs corresponding to a memory cell MC to be accessed, among a plurality of memory cells MCs of the memory 510, and transmit the addresses ADDs to the memory 510. The address generation unit 522 may generate a row address and transmit the row address to the memory 510 in a row operation of the memory 510, for example, an activation operation, a precharge operation and the like, and may generate a column address and transmit the column address to the memory 510 in a column operation of the memory 510 for example, a read operation, a write operation and the like. The address generation unit 522 may generate no address in a refresh operation of the memory 510, and when the detection signal DET is activated, the address generation unit 522 may generate an address corresponding to the detected word line based on the detection address DET_ADD outputted from the word line detection unit 523, and transmit the address to the memory 510.

According to the operations of the word line detection unit 523, it is possible to detect a frequently activated word line or a high active address through substantially the same operation as that of the word line detection unit 323 of FIG. 3.

Hereinafter, an operation of the memory system will be described. When the memory 510 refreshes one word line in response to the refresh command REF, and the target refresh command TRR_CMD is activated, the memory 510 refreshes three word lines, i.e., a word line corresponding to an address stored in the address storage unit 515, a first adjacent word line and a second adjacent word line, which are adjacent to the word line corresponding to the address stored in the address storage unit 515.

The memory controller 520 may transmit the command signals CMDs corresponding to the refresh command REF to the memory 510 at a set cycle. The memory 510 may sequentially refresh the plurality of word lines WL0 to WLN one by one whenever the refresh command REF is activated. The memory controller 520 may apply the active command ACT, the write command, the read command, the precharge command PRE and the like between the refresh commands REF, thereby accessing memory cells selected by an address among the memory cells MCs included in the memory 510.

When a frequently activated word line is detected, the memory controller 520 may transmit to the memory 510, the command signals CMDs corresponding to the target refresh command TRR_CMD and the addresses ADDs corresponding to the detection address DET_ADD. The memory 510 may store the input address IN_ADD in response to the target refresh command TRR_CMD, and sequentially output the stored address, the first adjacent address, and the second adjacent address as the target address TAR_ADD in a section in which the target refresh signal TRR has been activated. When the stored address corresponds to the WLK, the first adjacent address may correspond to the WLK−1 and the second adjacent address may correspond to the WLK+1. The memory 510 may sequentially refresh the WLK, WLK−1, and WLK+1 word lines in response to the target address TAR_ADD in the section in which the target refresh signal TRR has been activated.

The memory system according to the exemplary embodiment of the present invention may substantially prevent deterioration of data of a memory cell due to a word line disturbance, and may perform a high speed operation by minimizing a time necessary for the target refresh operation.

With reference again to FIG. 5, a memory system according to another embodiment will be described. A memory system may perform the target refresh operation whenever the normal refresh operation is performed by a set number of times.

The operations of the elements 511 to 519 of the memory 510 are substantially the same as those described in FIG. 5.

The memory controller 520 may transmit command signals CMDs corresponding to the refresh command REF to the memory 510 at a set cycle, and when a word line, which satisfies one or more of conditions that the number of activation times is equal to or more than the reference number and the activation frequency is equal to or more than the reference frequency, is detected from among the plurality of word lines WL0 to WLN, the memory controller 520 may transmit command signals CMDs corresponding to the target refresh command TRR_CMD and an address of the detected word line to the memory 510 when the command signals CMDs corresponding to the refresh command REF are transmitted by a set number of times.

The command generation unit 521 may generate the command signals CMDs for controlling an operation of the memory 510, and transmit the command signals CMDs to the memory 510. The command generation unit 521 may generate the command signals CMDs corresponding to the refresh command REF at a set cycle, and when the detection signal DET is activated, the command generation unit 521 may generate the command signals CMDs corresponding to the target refresh command TRR_CMD and transmit the command signals CMDs to the memory 510 whenever the command signals CMDs corresponding to the refresh command REF are generated by a set number of times.

The address generation unit 522 may generate addresses ADDs corresponding to a memory cell MC to be accessed, among a plurality of memory cells MCs of the memory 510, and transmit the addresses ADDs to the memory 510. The address generation unit 522 may generate no address in a refresh operation of the memory 510, and when the detection signal DET is activated, the address generation unit 522 may generate an address for selecting a word line corresponding to the detection address DET_ADD outputted from the word line detection unit 523 whenever the command signals CMDs corresponding to the refresh command REF are generated by a set number of times, and transmit the address to the memory 510.

The operations of the word line detection unit 523 are substantially the same as those of the word line detection unit 323 of FIG. 3.

Hereinafter, an operation of the memory system will be described. When the memory 510 refreshes one word line in response to the refresh command REF, and when the target refresh command TRR_CMD is activated, the memory 510 refreshes three word lines, i.e., a word line corresponding to an address stored in the address storage unit 515, a first adjacent word line and a second adjacent word line, which are adjacent to the word line corresponding to the address stored in the address storage unit 515.

The memory controller 520 may transmit the command signals CMDs corresponding to the refresh command REF to the memory 510 at a set cycle. The memory 510 may sequentially refresh the plurality of word lines WL0 to WLN one by one whenever the refresh command REF is activated. The memory controller 520 may apply the active command ACT, the write command, the read command, the precharge command PRE and the like between the refresh commands REF, thereby accessing memory cells selected by an address among the memory cells MCs included in the memory 510.

When a frequently activated word line is detected, the memory controller 520 may additionally transmit the command signals CMDs corresponding to the target refresh command TRR_CMD and the addresses ADDs corresponding to the detection address DET_ADD to the memory 510 whenever the refresh commands REF is transmitted by a set number of times. The memory 510 may store the input address IN_ADD in response to the target refresh command TRR_CMD, and sequentially output the stored address, the first adjacent address, and the second adjacent address as the target address TAR_ADD in a section in which the target refresh signal TRR has been activated. When the stored address corresponds to the WLK, the first adjacent address may correspond to the WLK−1 and the second adjacent address may correspond to the WLK+1. The memory 510 may sequentially refresh the WLK, the WLK−1, and the WLK+1 in response to the target address TAR_ADD in the section in which the target refresh signal TRR has been activated.

The memory system according to another embodiment may substantially prevent deterioration of data of a memory cell due to a word line disturbance, and may perform a high speed operation by minimizing a time necessary for the target refresh operation.

With reference to FIG. 5, a method for operating the memory system according to the exemplary embodiment of the present invention will be described.

The method for operating the memory system may include a step hereinafter, referred to as a "target refresh command transmission step" in which the memory controller 520 transmits the high active address and the target refresh command TRR_CMD to the memory 510 when the high active address is detected, and a step hereinafter, referred to as a "refresh step" in which the memory 510 sequentially refreshes the plurality of word lines WL0 to WLN in response to the refresh command REF inputted at a set cycle, stores the transmitted high active address in response to the target refresh command TRR_CMD, and refreshes word lines selected based on the stored address.

The memory controller 520 may transmit the refresh command REF to the memory 510 at a set cycle, and when the high active address is detected, the memory controller 520 may transmit the target refresh command TRR_CMD and the high active address to the memory 510 in the target refresh command transmission step.

In the refresh step, the memory 510 may perform the normal refresh operation or the target refresh operation in response to the refresh command REF. Particularly, the memory 510 may perform the normal refresh operation in response to the refresh command REF, and perform the target refresh operation on word lines, i.e., a frequently activated word line and one or more adjacent word lines, selected based on the high active address in response to the target refresh command TRR_CMD.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
   a memory suitable for including a cell array having a plurality of word lines and an address storage unit that stores an address in response to a capture command, wherein the memory sequentially refreshes the plurality of word lines in response to a refresh command inputted at a set cycle, and refreshes a word line corresponding to the stored address among the plurality of word lines in response to the refresh command when the address is stored in the address storage unit; and
   a memory controller suitable for transmitting the refresh command to the memory at the set cycle, and transmitting the capture command and an address of the detected word line to the memory, when a word line satisfying one or more of conditions that the number of activation times is equal to or more than a reference number and an activation frequency is equal to or more than a reference frequency is detected,
   wherein the memory further comprises:
   an address selection unit suitable for receiving an input address, a counting address, and the stored address in the address storage unit, outputting the input address when an active command is activated, outputting the counting address when a refresh signal is activated, and outputting the stored address when a target refresh signal is activated;
   a refresh control unit suitable for activating the refresh signal when the refresh command is activated, activating the target refresh signal when the refresh command is activated after the capture command is activated, and activating a refresh active signal in response to the refresh command; and
   a word line control unit suitable for activating a word line corresponding to an address outputted from the address selection unit among the plurality of word lines in response to the active command or the refresh active signal.

2. The memory system of claim 1, wherein the memory controller comprises:
   a word line detection unit suitable for activating a detection signal when the word line satisfying the conditions is detected from among the plurality of word lines;
   an address generation unit suitable for generating an address, and generating the address corresponding to the detected word line when the detection signal is activated; and
   a command generation unit suitable for generating the refresh command at a set cycle, and generating the capture command when the detection signal is activated.

3. The memory system of claim 1, wherein the memory selects one or more of the word lines corresponding to the stored address and one or more word lines adjacent to the word line corresponding to the stored address.

4. The memory system of claim 1, wherein the memory comprises:
   an address counting unit suitable for generating the counting address by performing a counting operation when the cell array is refreshed, wherein the address counting unit does not perform the counting operation when the word line corresponding to the stored address is refreshed.

5. The memory system of claim 4, wherein the memory further comprises:
   an address selection unit suitable for receiving an input address, the counting address, and the stored address in the address storage unit, outputting the input address when an active command is activated, outputting the counting address when a refresh signal is activated, and outputting the stored address when a target refresh signal is activated;
   a refresh control unit suitable for activating the refresh signal when the refresh command is activated, activating the target refresh signal when the refresh command is activated by a set number of times, and activating a refresh active signal in response to the refresh command; and
   a word line control unit suitable for activating a word line corresponding to an address outputted from the address selection unit among the plurality of word lines in response to the active command or the refresh active signal.

6. The memory system of claim 1, wherein the address storage unit outputs one or more of the stored address and one or more adjacent addresses when the target refresh signal is activated, wherein one or more adjacent addresses are addresses of one or more word lines adjacent to the word line corresponding to the stored address.

7. A memory system comprising:
a memory suitable for including a cell array having a plurality of word lines, sequentially refreshing the plurality of word lines in response to a refresh command inputted at a set cycle, and refreshing a word line corresponding to an input address and one or more adjacent word lines adjacent to the word line corresponding to the input address in response to a target refresh command; and
a memory controller suitable for transmitting the refresh command to the memory at the set cycle, and transmitting the target refresh command and an address of the detected word line to the memory when a word line satisfying one or more of conditions that the number of activation times is equal to or more than a reference number and an activation frequency is equal to or more than a reference frequency is detected
wherein the memory further comprises:
an address selection unit suitable for receiving an input address, a counting address, and the stored address in the address storage unit, outputting the input address when an active command is activated, outputting the counting address when a refresh signal is activated, and outputting the stored address when a target refresh signal is activated;
a refresh control unit suitable for activating the refresh signal when the refresh command is activated, activating the target refresh signal when the target refresh command is activated, and activating a refresh active signal when the refresh command or the target refresh command is activated; and
a word line control unit suitable for activating a word line corresponding to an address outputted from the address selection unit among the plurality of word lines in response to the active command or the refresh active signal.

8. The memory system of claim 7, wherein the memory controller comprises:
a word line detection unit suitable for activating a detection signal when the word line satisfying the conditions is detected from among the plurality of word lines;
a command generation unit suitable for generating the refresh command at a set cycle, and generating the target refresh command when the detection signal is activated; and
an address generation unit suitable for generating the address of the detected word line when the detection signal is activated.

9. The memory system of claim 7, wherein the memory controller comprises:
a word line detection unit suitable for activating a detection signal when the word line satisfying the conditions is detected from among the plurality of word lines;
a command generation unit suitable for generating the refresh command at a set cycle, and generating the target refresh command when the refresh command is activated by a set number of times; and
an address generation unit suitable for generating the address of the detected word line when the detection signal is activated.

10. The memory system of claim 7, wherein the memory stores the input address in response to the target refresh command, and refreshes one or more of a word line corresponding to the stored address and one or more word lines which are adjacent to the word line corresponding to the stored address.

11. The memory system of claim 7, wherein the memory comprises:
an address storage unit suitable for storing the input address in response to the target refresh command, and outputting one or more of the stored address and one or more adjacent addresses which are addresses of one or more word lines adjacent to a word line corresponding to the stored address.

12. The memory system of claim 11, wherein the memory further comprises:
an address counting unit suitable for generating the counting address by performing a counting operation when the cell array is refreshed, wherein the address counting unit does not perform the counting operation when the word line corresponding to the stored address is refreshed.

* * * * *